ELECTROPLATING PROCESS FOR SEMICONDUCTOR DEVICES

Filed Dec. 3, 1963

INVENTORS
FRANK J. SAIA
JOHN G. QUETSCH
BY W. Wallace McAllister Jr.
ATTORNEY.

3,324,015
ELECTROPLATING PROCESS FOR SEMICONDUCTOR DEVICES

Frank J. Saia, Costa Mesa, and John G. Quetsch, Anaheim, Calif., assignors to Hughes Aircraft Company, Culver City, Calif., a corporation of Delaware
Filed Dec. 3, 1963, Ser. No. 327,647
2 Claims. (Cl. 204—15)

This invention relates to semiconductor devices and to methods of fabricating such devices. More particularly, but not necessarily exclusively, the invention relates to a process for making ohmic (non-rectifying) connections to semiconductor bodies.

In certain semiconductor devices a rectifying junction-forming region is often provided in a semiconductor body by alloying a conductivity-type-determining impurity element or "button" thereto, and it is generally convenient to make an electrical connection to the junction-forming region simply by soldering or welding a wire or the like to the alloyed button. In certain devices of either the diffused or alloyed junction such an alloy button either does not exist or is removed. Such devices are commonly called "planar" since the junction-forming region is often submerged within the semiconductor body and has only a very small surface area exposed on a plane surface of the semiconductor body. In such planar devices the provision of a connection to the junction-forming region is a difficult achievement. This is especially true when the junction-forming region is formed by diffusing an impurity through a small window or opening in a non-conductive mask which is left in place on the semiconductor device to protect the surface and the rectifying junction therebeneath.

One technique for providing the necessary electrical connection to such a junction-forming region in this type of device is described in U.S. Patent No. 2,981,877 to R. N. Noyce, wherein a thin metallic conductive layer is vapor-deposited over an oxide mask and into the window therein to contact the exposed surface of the junction-forming region. While such an arrangement is satisfactory for many applications, it does require a substantially continuous layer of oxide (that is, one without pin-holes extending therethrough) in order to insure isolation of the conductive layer from other portions of the semiconductor body. Likewise, it is often still highly desirable to dispose such planar devices in conventional diode envelopes such as shown and described in U.S. Patent No. 2,694,168 to H. Q. North et al. wherein the semiconductor device is mounted in a tubular glass package having coaxial leads extending from each end thereof. In such a package, the semiconductor device is mounted on the end of one lead and a wire or whisker secured to the end of the other coaxial lead must be affixed to the junction-forming region or button on the semiconductor surface. Hence, providing a conductive layer of material on the oxide-coated surface of such a device does not aid appreciably in securing the necessary electrical connections when such a device is disposed in such a glass package.

One technique proposed for overcoming the above difficulties is that of intentionally providing a "button" secured to the junction-forming region where the junction-forming region is fabricated by processes, such as diffusion, which do not normally utilize such buttons. In this technique a small metal sphere is placed in the window in the oxide mask on the surface of the semiconductor body and fused thereto. Such technique is very costly in the time and labor required to accurately place the spheres in the desired location. This can be better appreciated when it is understood that the average opening or window in the oxide mask in a typical planar diffused device may be as small as about 2.0 mils in diameter. Other difficulties are encountered in this technique in the handling and moving of the semiconductor bodies once the spheres have been placed in position and prior to the fusion thereof to the semiconductor body as in loading such assemblies into the oven for accomplishing such fusion.

It is therefore an object of the present invention to provide an improved process for applying a metallic material to a surface of a semiconductor body.

Another object of the present invention is to provide an improved process for applying electrical connections to semi-conductor devices.

Another object of the invention is to provide an improved process for applying electrical connections to junction-forming diffused regions in semiconductor devices.

Another object of the invention is to provide an improved process for applying electrical connections to the junction-forming diffused regions in insulatingly-coated semiconductor devices.

Another object of the invention is to provide an improved process for applying metallic material to the junction-forming diffused region in insulatingly-coated semiconductor devices.

Yet another object is to provide an improved process for applying metallic connections to a semiconductor device through an insulating coating on the surface of such devices.

Still another object of the invention is to provide an improved semiconductor device of the planar diffused junction type in a coaxial lead container therefor.

These and other objects and advantages of the invention are realized by electrically brush-plating a metallic material onto the desired surface portions of a semiconductor body. Thus, the semiconductor body is connected into an electroplating circuit which includes a "brush" or plating element which holds the plating material so that the circuit may be closed and rendered operative for plating by contacting the "brush" to desired surface areas of the semiconductor body. In a typical embodiment, the surface of a semiconductor body of germanium or silicon, for example, may be covered with an electrically insulating material such as an oxide of the material of the semiconductor body, for example, and openings are provided through this material. The "brush" is then indiscriminately wiped or brushed across the insulating mask as well as across the openings therein whereby plating is effected only in these openings and results in the build-up of a mass of metal or "bump" in these openings which metallic masses are adherent to the portion of the semiconductor surface exposed through the openings. Lead wires or the like may be thereafter conveniently affixed or contacted to such a "bump" to provide the desired electrical connection therethrough to this portion of the semiconductor body. Such a lead wire may be the "whisker" in the conventional glass package for diode semiconductor devices described in the aforementioned patent to North et al.

The invention will be described in greater detail by reference to the drawings in which.

Figures 1, 2:
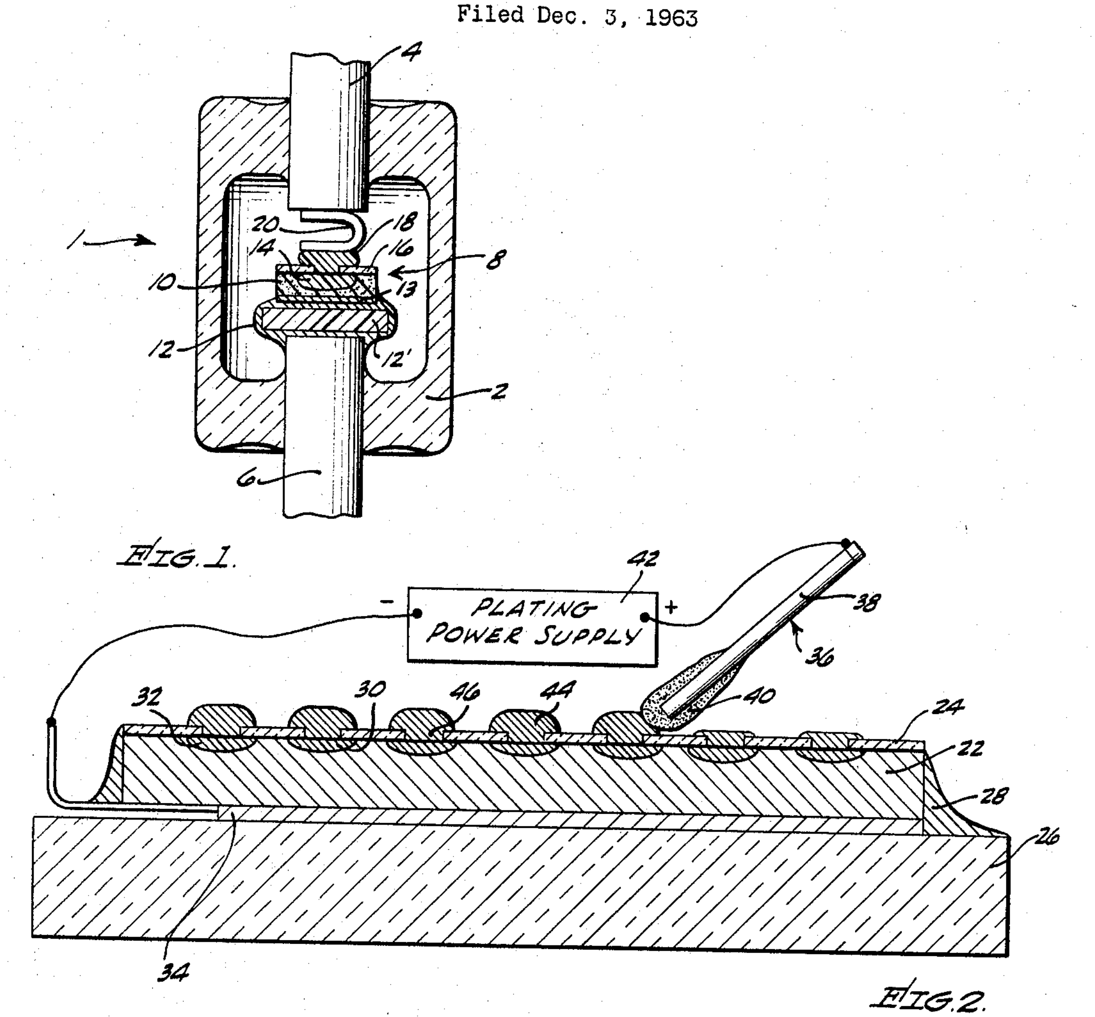
FIGURE 1 is a cross-sectional, elevational view of a semiconductor device fabricated according to the invention.
FIGURE 2 is an elevational view partly schematic and partly in section of apparatus for practicing the process of the invention.

Referring now to FIGURE 1 a completely packaged semi-conductor diode device 1 is shown for the purpose of illustrating the usefulness of the process of the invention in the fabrication thereof. The device 1 comprises a tubular glass package or envelope 2 having coaxial leads 4 and 6 extending from opposite ends thereof and hermetically sealed thereto. The leads 4 and 6 may be composed of a copper-clad iron-nickel alloy in the form of a wire about 20 mils in diameter, for example. Within the glass envelope and mounted on the end of the lead 6 is a semiconductor diode device 8 which comprises, for example, a silicon crystal member 10 the bulk of which may be of N-type conductivity. The silicon member or die 10 may be soldered to the lead 6 by means of a tin-copper solder preform as follows. The preform member 12 initially comprises a tin-clad copper plate 12' which is positioned on the end of the lead 6. The semiconductor die 10 is disposed on the tin-clad preform member 12 and the assembly is heated so as to melt the tin and some of the copper of the plate 12' to form a ternary solder of tin-copper-silicon which secures the semiconductor die 10 to the preform member 12 and the preform member to the lead 6 as shown. In order to insure an ohmic contact between the N-type semiconductor die 10 and the lead 6, the "back" surface of the silicon die may be provided with a gold-silicon eutectic layer 13 by previous processing as is well known in the art.

The remainder of the diode device 8 comprises a diffused P-type junction-forming region 14 disposed on the upper surface of the semiconductor die 10 with a protective non-conductive coating 16 over portions thereof including especially those portions where the junction between the P-type region 14 and the bulk of the N-type body 10 extends to the surface of the semiconductor die. This junction-forming P-type region 14 may be formed prior to assembly of the device 8 in the package by first masking the upper surface of the silicon die 10 to form the non-conductive coating 16 as by oxidizing this surface. A portion of this coating may then be removed, as by etching, to form an opening or window therein. Thereafter the thus-masked surface of the semi-conductor die is exposed to a diffusion atmosphere containing in vapor form a P-type impurity such as boron, for example, which by the process of diffusion forms the P-type region 14 through the opening in the mask and thereby establishes P–N rectifying junction under the protective oxide layer 16 which is left in situ. This process is well-known in the art and is fully described in U.S. Patents Nos. 2,802,760 to Derick and Frosch and 3,025,589 to Hoerni.

According to the present invention electrical contact to the P-type region 14 is provided by means of a metal fill or "bump" 18 through the opening in the oxide mask 16 by a process which will be more fully described hereinafter. Connection between this metal "bump" contact 18 and the lead member 4 is provided by means of a C-shaped wire or whisker element 20 which may be welded or otherwise secured to the end of the lead 4. The C-shaped wire 20 may be "tacked" to the "bump" contact 18 as by passing an electrical pulse therethrough to cause at least a partial fusion of the two, if desired. It is also possible to achieve good electrical contact by merely providing pressure contact between the spring-like C-shaped whisker 20 and the bump contact 18.

It should be understood that semiconductor devices such as shown in FIGURE 1 are extremely small to start with, the area of the surface of the die member 10 containing the junction-forming region 14 being about 400 sq. mils. In such a device it is customary to provide an opening in the non-conductive mask 16 which is only about 3.5 mils in diameter. Thus one is presented with the rather difficult and tedious operation of providing an electrical connection between the exposed surface of the die member through the window in the non-conductive mask 16 and a lead member such as the wire 4 as shown. Such connection is provided according to the present invention by a process termed "brush" or immersionless electroplating. While the process of the invention may be practiced on a single device or semiconductor die, it has been found more convenient and economical to perform the same on a number of devices simultaneously. This is particularly true inasmuch as it has been the practice, for the same reasons, to form a plurality of rectifying junction devices in a single large wafer of semiconductor material simultaneously as will be described hereinafter. Thus it should be understood that though the process of the invention is described as being performed on a semiconductor wafer, the practice is by no means limited thereto.

Referring now to FIGURE 2 a semiconductor wafer 22 which may be of silicon and about 3.0 mils thick and 1.25 in. in diameter and of N-type conductivity may be disposed in an oxidizing atmosphere so as to convert at least one surface thereof to form a layer 24 thereon of an oxide of the semiconductor material, such as $SiO_2$, for example. The semiconductor wafer 22 may have been formed or grown by the epitaxial process or it may be a wafer cut from an ingot of semiconductor material which was grown from a doped melt. While the use of an oxide of the semiconductor material comprising the wafer 22 is preferable because of its inertness and excellent masking properties against conductivity-type-determining impurities, the mask 22 could be formed of any suitable non-conducting material. The formation of such oxide layers is well known in the art and is amply described, for example, in U.S. Patent No. 2,802,760 to Derick and Frosch. A pattern of holes is then formed in the oxide layer 24 by means of well-known photo-resist techniques which exposes desired portions of the oxide layer through an etch-resistant coating. The oxide exposed through holes in the etch-resistant coating is then removed as by etching with hydrofluoric acid, for example, to expose portions of the surface of the silicon wafer 22 through the holes. The etch-resistant coating may then be removed altogether. Alternatively, it is possible to form the openings through the oxide layer 24 by mechanical engraving or scribing techniques.

The wafer 22 is then exposed to an atmosphere containing vapors of a conductivity-type-determining impurity whereby the impurity diffuses into the surface of the wafer through the openings in the oxide layer or mask 24. In the present example, where the wafer 22 is of N-type conductivity, a P-type impurity such as boron would be employed so as to establish a P-type conductivity region 30 beneath each hole in the oxide mask 24, each region forming a rectifying barrier 32 with the bulk of the N-type silicon wafer 22. It will be appreciated that the practice of the present invention is not limited to any particular arrangement of N-type and P-type regions and that the wafer 22 could be of P-type conductivity, in which case an N-type impurity would be diffused therein through the oxide mask 24 to form N-P rectifying barriers, for example. In either instance, the rectifying barriers 32 thus formed extend to the surface of the wafer 22 and under the protective oxide mask 24.

It will thus be understood that a plurality of rectifying devices have been provided in the silicon wafer 22. Previously it was the practice to "dice" the wafer so as to separate each junction-containing portion thereof and to provide individual dice for further device fabrication, it being common to make connections to the junction-forming regions 30 by means of wires or whiskers and the like as by thermo-compression bonding techniques. However, such procedures have proven either economically undesirable or extremely difficult and tedious of accomplishment as the desire for small devices has increased. If the deposition techniques were used for this purpose it would be extremely difficult and time-consuming to build-up the desired thickness of metal and to confine this metal to only the exposed surfaces in the holes of the non-conductive mask. As noted previously in devices of the present example, the opening through the mask 24 may be typically only 3.5 mils in diameter making it exceptionally difficult to provide electrical connections therethrough.

According to the present invention such electrical connections are efficiently and economically provided by the process of "brush" electroplating. The wafer 22 is provided with a "back" electrode member 34 by means of a metal plate which is secured to a support base or block 26 of glass, for example, the wafer 22 being disposed on the metal plate 34 with the masked surface being "up." The whole assembly of the wafer 22, the block 28, and the plate 34 may be temporarily secured together by means of mounting wax 28.

The "brush" 36 may comprise a centrally disposed core or rod 38 of carbon, for example, or other electrically conductive material on which is mounted an absorbent element or sleeve 40 of cotton wadding which may be soaked or saturated with a suitable metal-plating solution. The brush 36 is electrically connected into a plating circuit with a plating power supply 42 to which the backing plate 34 is also connected. As a typical example the power supply 42 may include a source of direct current capable of supplying from 75 to 300 milliamperes at 7 volts with the "back" side of the wafer 22 being connected by means of the backing plate 34 to the negative terminal thereof and the plating brush 36 to the positive terminal thereof. Plating into the holes of the non-conductive mask 24 and onto the exposed surfaces of the junction-forming regions 30 is accomplished by sweeping the brush 36 back and forth across the non-conductive layer and the holes therein which action results in gradually building up a mass 44 of plated metal in each hole in good electrical contact with the junction-forming regions 30 exposed therethrough and strongly adherent thereto. The wiping or sweeping action can be continued to build-up a relatively high mound or "bump" of metal to which electrical leads or wires may be readily attached by any suitable technique. After the achievement of the desired connection, the wafer 22 may then be diced as by scribing and etching or by sawing to form a plurality of semiconductor devices each containing a rectifying junction-forming region protected by a non-conductive mask and having an electrical connection to the junction-forming region constituted by a "bump" of metal, thus constituting the device 8 which is ready for subsequent packaging as shown in FIGURE 1.

A suitable plating solution for use in the process just described may be provided by mixing to each liter of deionized water 130 grams of potassium cyanide, 30 grams of potassium carbonate, 75 grams of silver cyanide and 15 grams of potassium hydroxide. It is preferred to add 3 grams of Silver Lume Brightner A, and 10 drops of Silver Lume Brightner B to this solution in order to enhance the plating action thereof. These brightners are described in U.S. Patent No. 2,666,738 to Otto Kardos, and are made and sold by Hanson-Van Winkle-Munning Co., of Matawan, New Jersey. This will provide a satisfactory plating of silver when used in the process described above. The solution may be used at room temperature or heated to 50° C.

While a silver plating is preferable because of its ready solderability to subsequently connected lead wires and the like, other electrolytically platable metals may be used in the process of the invention as desired. Where one desires to provide only a non-rectifying electrical connection to a region of a semiconductor body, the plating metal selected should be one which will either establish the same conductivity-type of that region or which does not normally affect the conductivity-type of the semiconductor region. It is, however, feasible to utilize the process of the present invention to provide non-ohmic or rectifying connections to predetermined portions of any semiconductor body, if desired. For this purpose one merely needs to use as a plating metal one which establishes conductivity of a type opposite to that of the region being plated.

The process of the invention may also be employed to apply metallic platings to any portions of a semiconductor body for any purpose whether or not the semiconductor body constitutes an electrical device having a P-N rectifying junction therein. Thus it may be desirable to plate a semiconductor body with a metallic strip so as to provide an electrically conductive path thereon as in "printed" microcircuitry-type applications where the semiconductor body may be serving, at least in part, as merely a non-conductive substrate or support element.

The plating current may be varied as desired depending upon the characteristics of the plating desired. Thus, the lower the plating current, the slower the plating action but the smoother and more uniformly shaped the plated "bump." On the other hand, while a higher plating current provides a faster plating action, the plated metal appears grainy and rougher (less smooth). Using the above plating solution and a plating current of about 150 milliamperes, smooth silver bumps about 3–4 mils high are obtained in about 4 minutes.

In some instances it may also be desirable to "flash-plate" the exposed silicon surface in the holes of the oxide 24 with gold in order to enhance the subsequent bump-plating action. To achieve such a flash-plating the semiconductor wafer is first immersed in a hydrofluoric acid bath for a few seconds, for example, to remove any oxide film which may have formed on the exposed wafer surface in the holes in the oxide layer 24. The formation of such an oxide film in these holes tends to provide an electrically insulating surface which is not particularly conducive for electroplating. Flash-plating these surfaces with gold will of course protect them from further oxidation until ready for "bump" plating.

The thus-cleaned wafers may be immersed in a gold electro-plating solution comprising, for example, 15 grams of potassium cyanide and 12 grams of potassium-gold cyanide in one liter of deionized water heated to and maintained at about $55\pm5°$ C. during plating in which the wafer is made the cathode. In a typical example, a satisfactory flashing or layer 46 of gold plating is obtained by this plating solution with a current of about 5 milliamperes. After the plating of gold is completed, the gold flashing 46 may be alloyed to the silicon wafer in the holes in the oxide mask by heating the wafer in an inert atmosphere at a temperature above the gold-silicon eutectic (i.e., 500° C.).

Figure 3:
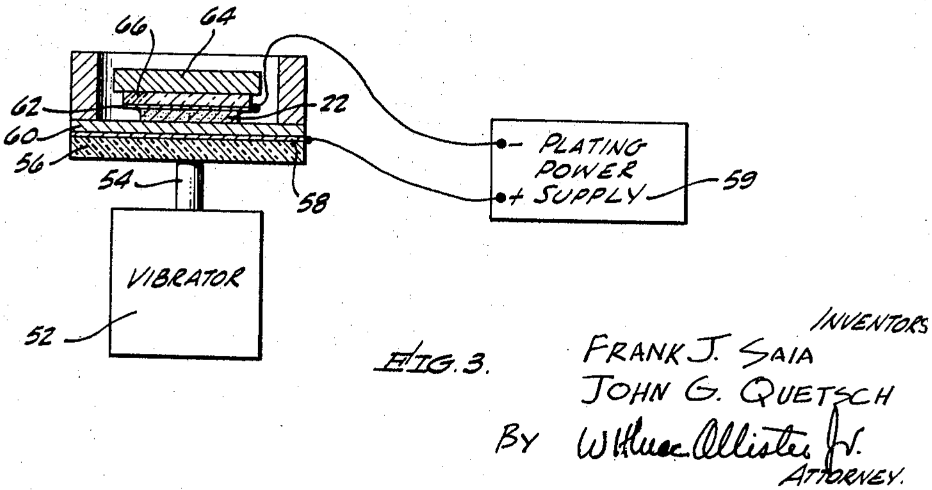
FIGURE 3 is an elevational view partly schematic and partly in section of apparatus for practicing the process of the invention according to another aspect thereof.

Referring now to FIGURE 3 an alternative apparatus for carrying out the "bump" plating process of the invention is shown wherein the absorbent element is vibrated in contact with the semiconductor wafer 22. The apparatus for achieving this action comprises an electrical motor vibrator 52 having an upwardly extending vibrating shaft 54 which may be driven by the vibrator motor 52 to vibrate laterally or circularly as desired. Mounted on the end of the vibrating shaft 54 is a support table or platform 56 which may be of glass or other electrically insulative material. An electrode plate 58 which may be of an electrically conductive material such as silver or stainless steel is mounted on the platform 56 and electrically connected to the positive terminal of a power supply 59. The electrode plate 58 corresponds to the core member 38 of the brush plating device 36 shown in FIGURE 2. Upon the electrode plate 58 is disposed a plating element 60 including a hard nap cloth 60 or the like saturated with a silver plating solution such as described before. The silicon wafer 22 is placed on the solution-saturated cloth 60 with the oxide layer 24 and its holes exposing surface portions of the silicon wafer face down and in contact with the cloth plating element 60. A back plate 62, corresponding to the back plate 34 in the apparatus of FIGURE 2, is placed on the wafer 22 and electrically connected to the negative terminal of the power supply 59. Good pressure contact between the various elements of the assembly is insured by placing a weight 64 on top of the assembly. If the weight 64 is of metal or other electrically conductive material it may be necessary to electrically isolate it from the assembly by interposing an electrically insulating block or plate 66 of glass, for example, between the weight 64 and the back plate electrode 62.

Upon energization of the vibrator motor 52 it will be appreciated that a brushing or wiping action between the lower surface of the wafer 22 and the solution-saturated plating element 60 will be obtained resulting in the build-up of electrically conductive platings or bumps 44 in the holes provided through the oxide mask 24 as with the apparatus in FIGURE 2. A typical vibration frequency of 60 cycles per second may be employed and with the previously mentioned silver plating solution and plating power supply, round, smooth metal bumps of about 2.5 mils in height may be obtained in about 15 minutes.

There thus has been described a novel and useful plating process especially advantageous for providing metallic platings in extremely small areas as in semiconductor devices of the type in which small openings to junction-forming regions are provided through electrically insulating protective layers or masks. It should be understood that a significant feature of the electroplating process of the present invention is that plating is accomplished without immersing the object into a plating solution or bath.

As used herein and in the appended claims the terms "saturate" and "saturating" mean treating the plating element with plating solution so that at least some plating solution is held or retained thereby. While thorough or complete permeation or impregnation of the plating element with plating solution is contemplated and may be satisfactory, it is not necessary that the plating element be so saturated that no more plating solution or liquid can be absorbed thereby.

What is claimed is:

1. The process of electroplating surface portions of a semiconductor body which portions are exposed through openings in an electrically insulating layer on said body comprising the steps of:

(a) connecting said semiconductor body to a source of electrical current;

(b) saturating a plating element with a plating solution;

(c) connecting said plating element to said source of electrical current;

(d) contacting said plating element to said exposed surface portions of said semiconductor body;

(e) and vibrating said plating element while maintaining said element in contact with said exposed surface portions.

2. The process of fabricating a plurality of semiconductor devices comprising the steps of:

(a) forming an electrically insulating layer on a surface of a semiconductor body having a predetermined type of conductivity;

(b) opening a plurality of holes in said insulating layer to expose a plurality of surface portions of said semiconductor body through said insulating layer;

(c) diffusing into said exposed surface portions of said semiconductor body through said holes a material which establishes conductivity of a type different from said predetermined type to thereby form a plurality of rectifying barriers in said semiconductor body;

(d) connecting said semiconductor body to a source of electrical current;

(e) contacting said exposed surface portions of said semiconductor body with a plating element carrying a plating material connected to said source of electrical current to thereby form electrical connections to said exposed surface portions of said semiconductor body in said holes in said insulating layer;

(f) and vibrating said plating element while maintaining said element in said contact with said insulating layer and said holes therein.

References Cited

UNITED STATES PATENTS

| | | | |
|---|---|---|---|
| 493,277 | 3/1893 | Lugo | 204—15 |
| 2,061,592 | 11/1936 | Rapids | 204—224 |
| 2,522,082 | 9/1950 | Arnold | 134—1 |
| 3,188,251 | 6/1965 | Straight et al. | 148—179 |

FOREIGN PATENTS

| | | |
|---|---|---|
| 18,643 | 1899 | Great Britain. |
| 493,108 | 9/1938 | Great Britain. |
| 864,705 | 4/1961 | Great Britain. |

JOHN H. MACK, *Primary Examiner.*

T. TUFARIELLO, *Assistant Examiner.*